United States Patent [19]
Molo et al.

[11] Patent Number: 4,578,790
[45] Date of Patent: Mar. 25, 1986

[54] SYSTEM AND EQUIPMENT FOR SINGLE SIDE BAND MULTIPLEXING THROUGH DIGITAL PROCESSING

[75] Inventors: Francesco Molo, Milan; Silvio Cucchi, Gaggiano; Gianfranco Cariolaro, Feriole Di Teolo, all of Italy

[73] Assignee: Telettra-Telefonia Elettronica e Radio S.p.A. Corso Buenos Aires, Milan, Italy

[21] Appl. No.: 502,710

[22] Filed: Jun. 9, 1983

[51] Int. Cl.[4] .............................. H04J 4/00
[52] U.S. Cl. ........................ 370/50; 370/70
[58] Field of Search ............ 370/50, 70; 455/59, 455/103, 104, 109

[56] References Cited

U.S. PATENT DOCUMENTS 3,676,598  7/1972  Kurth .................... 370/70
4,199,660  4/1980  Dill et al. ................ 370/50

OTHER PUBLICATIONS

Mano–"TDM–FDM Transmultiplexer"–Conf. ICC '80, 1980 Inter. Conf. on Comm. Seattle Wash. Jun. 1980, pp. 47.4.1-5.
Williams et al.–"Design of Digital SSB Modulators"–Conf. Eleventh Annual Asilomar Conf. on CKT. Systems & Computers–Pacific Grove, Calif.–Nov. 1977, pp. 184–193.
Kurth–"SSB/FDM"–IEEE Trans. on Comm. Tech., vol. com-19, No. 1, Feb. 1971, pp. 63-71.
Molo–"Transmultiplexer"–Conf. 1981, Inter. Conf. on Comm., Denver, Colo., Jun. 1981, pp. 18.7.1-5.

Primary Examiner—Joseph A. Orsino, Jr.
Attorney, Agent, or Firm—Holman & Stern

[57] ABSTRACT

The system and equipment according to the invention carry out the (SSB) frequency multiplexing and demultiplexing of N base band sampled signals by purely digital processing. On the multiplexing path the apparatus comprises a time invariant single filter having a single input and only one output. At said unique filter input the N signals to be multiplexed are applied which are in form a single signal that is the time multiplexing of said N signals. The signal at the filter output is sent to a successive modulator which is a multiplier having a time varying multiplying coefficient. The real samples of the modulator output signal provide the SSB frequency multiplexed signal of the N incoming signal paths. Similar operations are carried out on the demultiplexing path: the real samples of the frequency multiplexed signal are applied to a modulator operated according to a law similar to that of the multiplication path, and the complex samples at the output of said modulator are applied to a time invariant filter similar to that on the multiplexing path. The samples at the output of said filter are the time multiplex of the N band base signals.

9 Claims, 12 Drawing Figures

SYSTEM AND EQUIPMENT FOR SINGLE SIDE BAND MULTIPLEXING THROUGH DIGITAL PROCESSING

The present invention relates to a method or system to carry out the frequency multiplexing and demultiplexing of a given number of sampled signals using digital signal processing. As to the multiplexing path, if N signals sampled at a frequency $F_o$ are available, it is possible to effect single side band (SSB) frequency multiplexing of the above signals thereby obtaining a single signal sampled at a frequency of $F=NF_o$ where $F_o$ is the sampling frequency of the input signals.

In the multiplexed signal the frequency spectra are adjacent each other and are arranged in the frequency range of from 0 to F/2.

Methods are known to perform SSB frequency multiplexing through digital processing, which methods can be classified in three categories, each having however its own peculiarity. In the first category use is made of a discrete Fourier transform applied on the samples of the N input signals and followed by N or 2N filters working at a sample speed of $F_o$ (see e.g. U.S. Pat. No. 3,971,922 and U.K. Pat. No. 1,517,675).

The second category performs frequency multiplexing in several successive steps, firstly multiplexing in a similar way channel groups, each group having a N submultiple number of channels; a similar procedure is repeated on the signals coming out of the previous modulation stage and so on until a single output is obtained (see e.g. U.K. Pat. No. 2,030,822 and the paper "Digital TDM/FDM Translator with Multistage Structure" in "IEEE Transactions on Communications" No. 5, May 1978).

The third category processes separately every input signal which is singularly located in the final frequency position, this being the simplest multiplexing method.

A complete and recent overview of the above mentioned several methods is presented in the paper "A Comprehensive Survey of Digital Transmultiplexing Methods" published in "Proceedings of the IEEE" No. 11, November 1981.

The system according to the present invention differs substantially from the previous ones in that the frequency multiplexing operation is performed in one block for all the N input signals which, in the form of time multiplexed signals, enter a single time invariant filter for which implementation methods are described below. At the output of said single filter is connected a single multiplier having a multiplying coefficient varying with a time period N, and providing an effect equivalent to N conventional digital modulations. The real samples of the signal coming out the modulator constitute the SSB frequency multiplexing of said N input signals. Therefore, in its simplest generality, the system according to the invention for SSB frequency multiplexing (FDM) of a time division multiplexed signal (TDM) is characterized in that said (TDM) signal is subjected to complex time invariant filtering; in that the so filtered signal is modulated by a complex periodic carrier wave; and in that only the rear part of the so modulated signal is taken, which real part corresponds to the SSB multiplexed (FDM) signal.

The equipment for embodying this system is characterized by a time invariant complex filter, a modulator fed with a complex periodic carrier wave and a block for the transfer of only the real part of said complex modulated signal.

A relevant feature of the invention is that the type of filtering and modulation are univocal, i.e. only one solution for them exists, once the external performances of these type of equipment are defined; more specifically the filtering has a pulse time response of the type $h(nT) = h(nT) W_{2N}^{-n^2}$, while the modulating carrier is time periodic and given by $W_{2N}^{n^2}$. In an equivalent form of implementation the time multiplexed (TDM) input signal is processed in two paths, each one comprising a real time invariant filter and a modulator with a real periodic carrier, and the SSB frequency multiplexed signal is obtained through a summation of the signals at outputs of said two paths.

A further relevant feature of the invention is that the inverse operation, i.e. the conversion of a frequency multiplexed (FDM) signal into a time multiplexed (TDM) signal, is obtained through modulation of an FDM signal by a complexed periodic carrier, and then filtering the resulting signal with a complex time invariant filter; the TDM output signal is given by the real part of the samples of the signal coming out of the filter, and modulation and filtering operations are the same, as performed on the TDM-FDM side.

As a consequence only a conversion in one direction has to be described, for example the TDM-FDM side, in that a similar way of working is found in the reverse conversion.

The invention will be described with reference to FIG. 1, which schematically represents the TDM-FDM path in its simplest generality. The signal x(nT) at input 1 is the time multiplexing format of the N input baseband signal which have to be frequency multiplexed. The signal x(nT), represented in FIG. 2, has its samples separated from each other by the time interval T, and the set of time samples at relative distance of $T_o=NT$ pertein to a single input signal. The time sample of a generic input signal marked with index k can be represented by $x(nT_o+kT)$ where k is a fixed integer; for example in FIG. 2b are indicated the samples of the input signal $x(nT_o)$ for k=o, and in FIG. 2C the samples, for a generic constant value k, of the signal $x(nT_o+kT)$. The time multiplexed signal x(nT) is sent to the input of the time invariant filter 2, having a time pulse response indicated by the set of time samples h(nT), and a frequency response with period $NF_o=F$.

The output samples from filter 2, at a time rate F, are applied to modulator (digital multiplier) 3, to which the modulating signal with time samples $$W_{2N}^{n2} = e^{j\frac{2\pi}{2N} n2}$$

is also applied at input terminal 6. Said modulator multiplies the sample of the input signal x(nT), at time nT, by the complex quantity $W_{2N}^{n2}$, whose values, for N even, repeat in time with period $T_o=NT$.

The signal y(nT) at the output of modulator 3 is the complex frequency multiplexed signal, and the frequency spectrum pertaining to the input signal with index k is located in the frequency range from $kF_o$ to $(k+\frac{1}{2})F_o$, where k varies from 0 to $N-1$.

Figure 1:
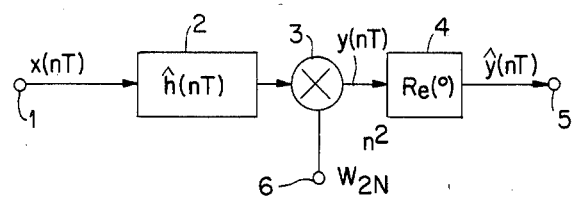
FIG. 1 is a functional block diagram of the frequency multiplexing system according to the present invention.
Figure 2A:
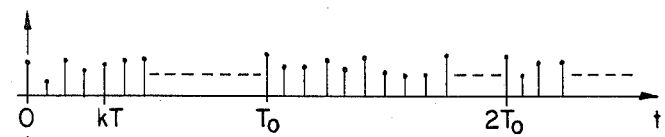
FIG. 2(a) is a time plot of the time-multiplexed format of the N base band input signals to be frequency multiplexed in the circuit of FIG. 1, said N input signals being designated by an index k having values from 0 to N−1.
Figure 2B:
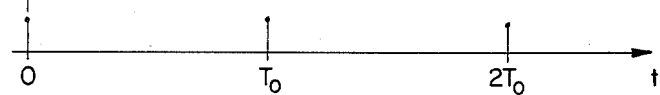
FIG. 2(b) is a time plot of the samples of the input signal for k set equal to zero.
Figure 2C:
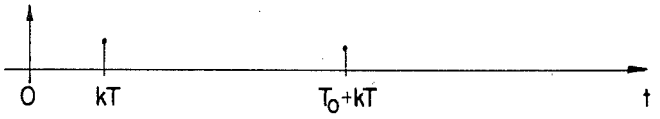
FIG. 2(c) is a time plot of the samples for the generic kth input signal.

The block 4 in FIG. 1 allows only the real part of the samples y(nT) reach the output 5, where we have the real signal y(nT) which in the frequency range from 0 to F/2 contains, separated in frequency and adjacent each other, the spectra of the N input signals arranged in increasing frequency order: 0, N−1, 1, N−2, 2, ... N/2−1, N/2.

To better explain the operation of the system and related equipment, as well as of the filter h(nT) of FIG. 1, the starting point of taken is the simplest way of frequency multiplexing, whereby the N input signals are individually filtered and modulated; such a method is quite conventional, but it is used here as a reference means to better explain the invention.

The spectra pertaining to the signals of such a conventional and simple modulation method are represent in FIG. 3.

Figure 3A:
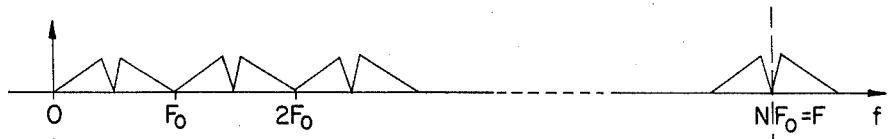
FIG. 3(a) is a plot of amplitude versus frequency for each input signal applied to the circuit of FIG. 1 and sampled at a frequency $F_o$.

The spectrum of a generic input signal $x_k(nT+kT_o)$, which has a frequency repetition period of $F_o$, in illustrated in FIG. 3a. Such a spectrum is filtered through the complex filter h(nT) having a frequency spectrum shown in FIG. 3b; said filter passes essentially that part of the input signal spectrum located between the frequency range from 0 to $F_o/2$, and its frequency repetitions with period $F=NF_o$. The output spectrum is frequency shifted via modulation by the amount $kF_o$, toward increasing frequencies, as represented in FIG. 3C. The spectra of those input signals, which after the modulation step are located above the frequency $F_o/2$ (for these spectra is $k \geq N/2$), have to be inverted with respect to frequency, which is achieved by multiplying the input samples alternately by the number +1 and −1. If the above procedures are applied to all input signals and the N signal samples coming out of the N modulators are summed together, the complex frequency multiplex signal is obtained, and said multiplex signal has the N spectra representative of the input signals arranged as shown in FIG. 3d.

Figure 3B:
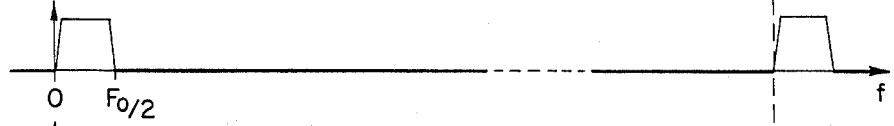
FIG. 3(b) is the amplitude versus frequency characteristic of a complex filter incorporated in the circuit of FIG. 1.
Figure 3C:
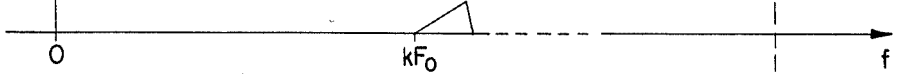
FIG. 3(c) is a plot of amplitude versus frequency for the selected portion of the spectrum of the kth signal in the frequency range from 0 to $NF_o$.
Figure 3D:
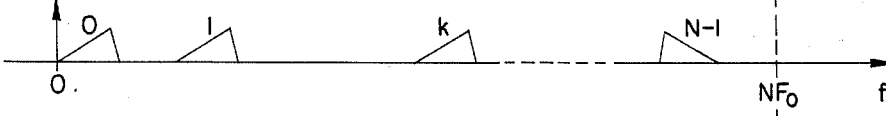
FIG. 3(d) is a plot of amplitude versus frequency indicating the frequency location of all N input signals which form the complex multiplexed input signal in FIG. 1.
Figure 3E:
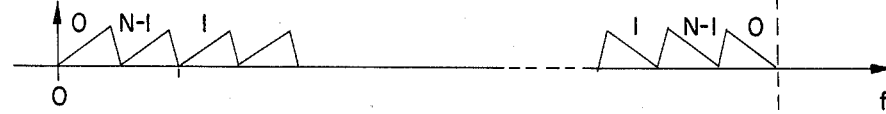
FIG. 3(e) is a plot of amplitude versus frequency representing the spectrum of the real part of the signal in FIG. 3(d)

If only the sampled real parts of the signal are retained, they provide the final real frequency multiplexed signal, with a frequency spectrum as illustrated in FIG. 3e.

Figure 4:
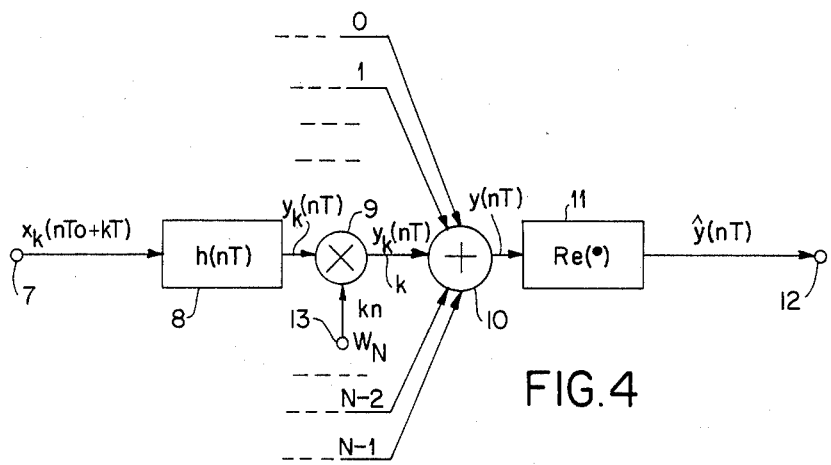
FIG. 4 is a functional block diagram of a procedure for obtaining the frequency multiplex signal.

The procedure as above explained can be schematically described along the well known scheme of FIG. 4.

At input 7 of FIG. 4, pertaining to the k-th input signal, the samples $x(nT_o+kT)$ are applied. These samples enter the filter 8 h(nT). The output signal $s_k(nT)$ can be represented through a convolution between two time sequences, that is, $$s_k(nT) = \sum_{r=-\infty}^{\infty} h(nT - rT_0 - kT) \times (rT_0 + kT)$$

After filtering, the modulator 9 shifts the frequency spectrum by means of the modulating signal $W_N^{kn}$ applied to input 13 of the modulator, and the output signal $y_k(nT)$ coming out of modulator 9 can be represented as $$y_k(nT) = W_N^{kn} s_k(nT)$$

The adder 10 of FIG. 4 sums the samples of the N signal $y_k(nT)$ with k ranging from 0 to $N-1$, and the signal at the output of said adder, and therefore $$y(nT) = \sum_{k=0}^{N-1} \sum_{r=-\infty}^{\infty} h(nT - rNT - kT) \times (rNT + kT) W_N^{n(k+rN)}$$

where use has been made of the relations:

$$T_o=NT, \text{ and, } W_N^{nrN}=1.$$

Introducing the new variable $=rN+k$, the double summation on the integer values taken by the variables k and r can be substituted with a summation on the new variable, and therefore we can write $$y(nT) = \sum_{l=-\infty}^{\infty} h(nT - lT) \times (lT) W_N^{nl} \quad (1)$$

where now x(lT) is the time multiplexing of the N input signals, indicated before with x(nT).

As already explained with reference to FIG. 1, the block 11 of FIG. 4 permits only the real part of the input samples to reach the output, and the real frequency multiplexed signal is available at output 12.

Relation (1) gives the simplest representation of the frequency multiplexing operation performed on N baseband signals; a proper manipulation of relation (1) permits explanation of the operation of the present invention.

Using the simple algebric relation $$2nl= -(n-l)^2+n^2+l^2$$

one obtains $$W_N^{ln} = W_{2N}^{2nl} = W_{2N}^{-(n-l)^2} \cdot W_{2N}^{n2} \cdot W_{2N}^{l2} \quad (2)$$

and the signal y(nT) can now be represented under the form $$y(nT) = W_{2N}^{n2} \sum_{l=-\infty}^{+\infty} h(nT - lT) W_{2N}^{-(n-l)^2} \times (lT) W_{2N}^{l2} \quad (3)$$

The factor $W_{2N}^{r^2}$ can be neglected, which means a non-essential phase shift of the modulating signal $W_N^{kn}$ applied to the modulator 9 of FIG. 4, and the factor $W_{2N}^{n^2}$ represents the modulation operation performed by the modulator 3 of FIG. 1.

Neglecting the factor $W_{2N}^{r^2}$ in (3), the term under the summation symbol is the convolution of the signal $x(lT)$ with the filter $h(nT)$, whose time samples of the pulse response are linked to those of the filter $h(nT)$ through the relation $$h(nT) = h(nT)W_{2N}^{-n^2} \qquad (4)$$

Methods are known to design filters with pulse response $h(nT)$ corresponding to the frequency behaviour of the filter as represented in FIG. 3b.

If the filter $h(nT)$ is of the non-recursive type, the filter $h(nT)$ can be computed using relation (4), while if the filter $h(nT)$ is of recursive type, relation (4) can be further transformed to obtain a simple filter implementation. The case in which $N = M^2$ is here considered, pointing out that a treatment, similar to the one to be given, can be applied when $N = M^2/2$, and so the cases of the more practical significance, in which N is a power of the number 2, are covered.

Applying the Z-transform to relation (4) one gets:

$$H(z) = \sum_{n=0}^{\infty} h(nT)W_{2N}^{-n^2}z^{-n}$$

and using the new variable $n = Mr + s$, where the integer r takes on positive values, and s takes on integer values from 0 to $M-1$, we obtain:

$$H(z) = \sum_{r=0}^{\infty} \sum_{s=0}^{M-1} h(MrT + sT)W_{2N}^{-[M^2r^2 + s^2 + 2Mrs]}z^{-(Mr+s)} \qquad (5)$$

As is $N = M^2$ we have $$W_{2N}^{-M^2r^2} = e^{j\frac{\pi}{N}M^2r^2} = e^{j\pi r^2} = (-1)^r$$

and furthermore $$W_{2N}^{-2Mrs} = W_M^{rs},$$

where $$W_M = e^{j\frac{2\pi}{M}}$$

and so the relation (5) becomes:

$$H(z) = \sum_{s=0}^{M-1} W_{2N}^{-s^2}z^{-s} \sum_{r=0}^{\infty} h(MrT + sT)(-z^M W_M^s)^{-r}$$

The problem of designing the filter $H(z)$ can be solved in compact form if the filter $H(z)$ can be represented along the parallel decomposition $$H(z) = \sum_{s=0}^{M-1} z^{-s}H_s(z^M) \qquad (6)$$

In such a case the the terms $z^{-s}$ in (6) can simply be multiplied by the factor $W_{2N}^{-s^2}$ and the variable $z^M$ in (6) is replaced by the term $-z^M W_M^s$.

The complex filter $H(z)$ can be designed in the following form $$H(z) = P(z) \cdot Q(z^M)$$

where $P(z)$ is a non recursive filter, while $Q(z^M)$ can be a filter of a more general type, with frequency period of frequency response equal to F/M.

As is $$P(z) = \sum_{l=0}^{L} p_l z^{-l},$$

we can simply transform $P(z)$ into $$P(z) = \sum_{s=0}^{M-1} z^{-s}P_s(z^M)$$

where the polynomials $P_s$ include the coefficients $p_l$ for which $l \equiv s$ (modulo M). For purpose off a clearer explanation we assume in the sequel $N = 64$ (which is a case of practical significance), and $M = 8$.

With this last assumption we find for $H(z)$ $$H(z) = \sum_{s=0}^{7} z^{-s}P_s(z^8)Q(z^8) \qquad (7)$$

and therefore $$H(z) = \sum_{s=0}^{7} W_{128}^{-s^2}z^{-s}P_s(-z^8 W_8^s)Q(z^8 W_8^s) \qquad (8)$$

Figure 5:
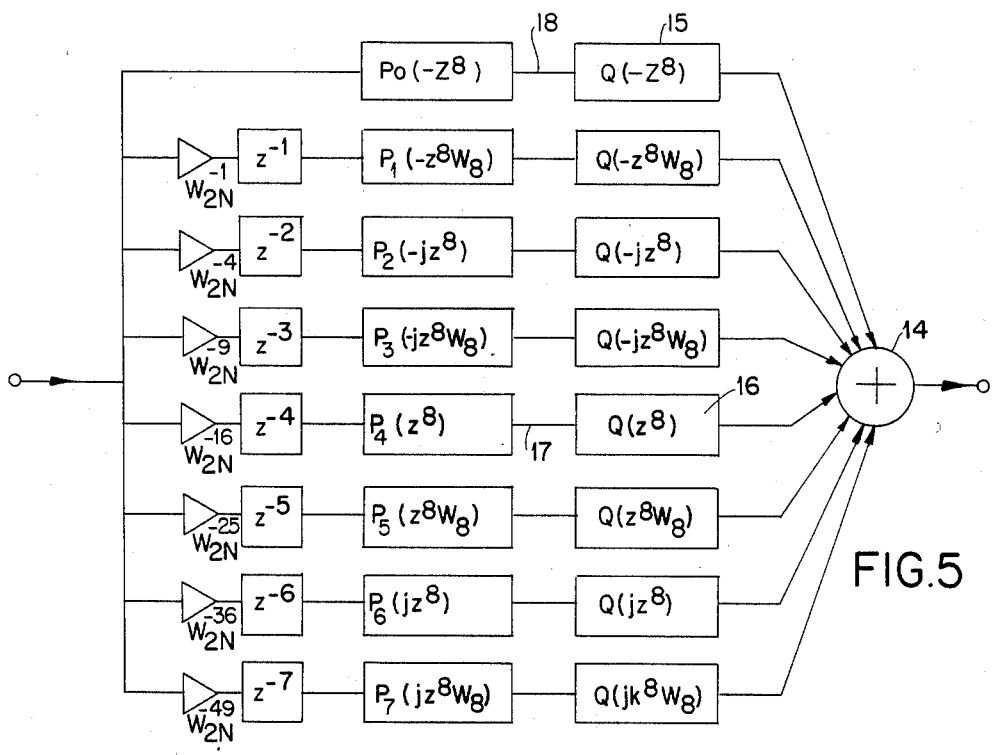
FIG. 5 is a functional block diagram for an implementation of the filter h(nT) in the circit of FIG. 1 where N represents the number of signals to be frequency multiplexed and is equal to $M^2$ or $M^2/2$, M being an integer and, in the particular embodiment illustrated, N is equal to 64.
Figure 6:
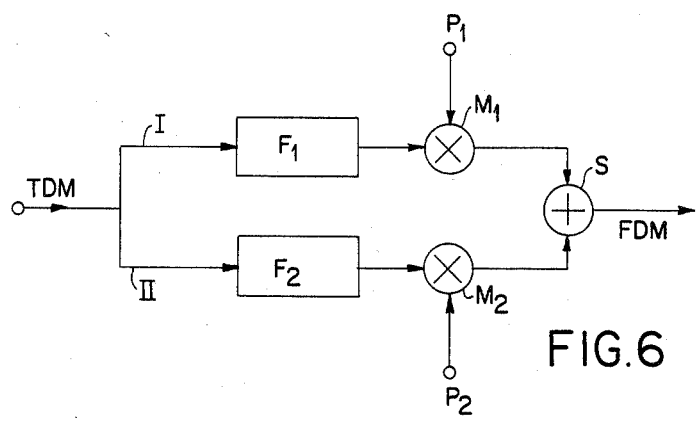

Relation (8) represents a parallel decomposition of the filter $H(z)$ into eight filters, each having a different value of the index s; such a decomposition is represented in FIG. 5.

Further transformations are possible on the structure of FIG. 5, and these depend upon the particular design details of the filter $H(z)$, and upon the way the arithmetic processing implied by the filter is performed.

By way of example if the filter $Q(z^8)$, appearing in relation (7), admits the decomposition $$Q(z^8) = Q_o(z^8)Q_1(z^{16})Q_2(z^{32})Q_3(z^{64}) \qquad (9)$$

the filter $Q_3(z^{64})$ is not affected by the transformation of $z^8$ into $-z^8 W_8^s$ that transforms the filter $H(z)$ into the filter $H(z)$, so that the filter $Q_3(z^{64})$ appears in series in everyone of the eight path of FIG. 5: these eight filters can be replaced by a single filter inserted in series on the output of the adder 14 in FIG. 5.

Furthermore, the filtering structure of FIG. 5, includes couples of equal filters with equal arguments except for an opposite sign of the arguments themself; for example, this is the case for the two filters 15 and 16 represented by the functions $Q(-z^8)$ and $Q(z^8)$. As the signals coming out of these filters are added, if $X_1$ and $X_2$ are the input signals at said filters at poins 18 and 17, we can first decompose these filters, if they are of non recursive type, into $Q_p$ and $Q_d$, containing respectively even and odd powers of the variable $z^8$, so that the sum of the output signals of the two filters is $$X_1(Q_p - Q_d) + X_2(Q_p + Q_d)$$

or equivalently $$(X_1+X_2)Q_p+(X_2-X_1)Q_d$$

As seen from the last relation, a single $Q_p$ part filters the sum of the input signals, and $Q_d$ the difference of the same signals.

As a further comment, if the filter $(Q(z^8)$ admits the decomposition along (9), the couples of filters of FIG. 5 with opposite argument have as a common factor the product $Q_1(z^{16})Q_2(z^{32}) \cdot Q_3(z^{64})$ (with properly transformed argument); said product transforms into a single filtering element inserted as a common path at the output of the couples of filters containing only the $Q_o(\cdot)$ term.

As a special case, under the condition that N is even, if we write $$H(z) = \sum_{s=0}^{N-1} z^{-s} H_s(z^N)$$

and $$H(z) = \sum_{s=0}^{N-1} W_{2N}^{-s^2} z^{-s} H_s(z^N)$$

this last expression can be directly implemented in a convenient way if N is not too high.

What follows is a short description of the demultiplexing side of the equipment, and in fact every sufficiently skilled technician can correctly implement the demultiplexing side, along the same principles of the multiplexing side, as far this last one is known.

For the purpose of clarity and as already done for the multiplexing side, operation is described starting from the simplest implementation of demultiplexing.

If $y(nT)$ provides real samples of the frequency multiplexed signal, the spectrum pertaining to a single baseband signal with index k is located in the frequency range from $kF_o$ to $(k+\frac{1}{2})F_o$; using a modulator, such a spectrum is shifted into the frequency range between 0 and $F_o/2$, and filtered out with a filter with a pulse response $h(nT)$, and a pass-band in the frequency range from 0 to $F_0/2$ and periodicity $NF_o$.

The above can be represented by the relation $$x_k(sT) = \sum_{n=-\infty}^{\infty} y(nT) W_N^{-kn} h(sT - nT) \quad (10)$$

where the samples $x_k(sT)$ of the base-band signal are complex and with a time ratio of $NF_o$. If we retain only the samples at the time instants $NT+kT$, with k a constant integer, we obtain the base-band complex signal of index k, sampled at a rate $F_o$, and only the real part of the samples has to be taken.

As we have $$W_N^{-kn} = W_{2N}^{(k-n)^2} \cdot W_{2N}^{-k^2} \cdot W_{2N}^{-n^2} \quad 60$$

the relation (10) can be written under the form:

$$x_k(lNT + kT) = \quad (11)$$

$$W_{2N}^{-k^2} \sum_{n=-\infty}^{\infty} y(nT) W_{2N}^{-n^2} h(lNT + kT - nT) W_{2N}^{(lNT+kT-nT)^2}$$

As was the case for the multiplexing side, the factor $W_{2N}^{-k^2}$ can be neglected and so, for k in the range of integers from 0 to $N-1$, the signal (11) representing the time multiplexing of the N base-band signal can be obtained with following processing: the frequency multiplexed signal $y(nT)$ enters a modulator with multiplying coefficient given by $W_{2N}^{-n^2}$, and the samples at the output of the modulator are sent into a filter with time response $h(nT)$, and $h(nT)$ is connected to the pulse response of a filter $h(nT)$ through the relation $$h(nT) = h(nT) W_{2N}^{n^2}$$

We must point-out that if $W_N^{kn}$ is substituted to $W_N^{-kn}$ into (10), the samples of the original signal of index $N-k$ are obtained, and in such a situation we can resort to the relation (2), used on the multiplexing side.

With the above substitution the multiplexing and demultiplexing sides have equal filters and modulators except for their order reversal in the path of the signal, and on the demultiplexing side, at time instants $lNT+k$ with a constant k, the samples of the base-band signal of index $N-k$ are obtained; this is equivalent to saying that the time multiplexed signal at the output of the receiving side has the base-band signals in time reversed order with respect to the transmitting side.

As an alternative to the described equipment, the Weaver modulation procedure can be used; more explicitely, the signal spectra given in FIG. 3, rows a, b, c, d, can be shifted by the amount $F_o/2$ toward decreasing frequency. This can be done by multiplying subsequent samples of each base-band input signal by subsequent positive integer powers of the imaginary coefficient j.

The filter $h(nT)$, if symmetrical with respect to the pass-band center frequency, has real coefficients; as a consequence of this assumption, most of the filters of FIG. 5 have purely real or purely immaginary coefficients and the computational complexity of the system is substantially reduced.

We claim:

1. A system for single sideband frequency muliplexing several input signals which are in the form of a single time multiplexed signal, said system comprising:
   a complex time invariant filter for filtering said time multiplexed signal to provide a filtered signal, said filter having an impulse response given by $h(nT) = h(nT) W_{2N}^{-n^2}$ wherein $W_{2N}$ is equal to $\exp(j2\pi/2N)$, j being the imaginary unit, N an even integer equal to the number of signals to be frequency multiplexed, T the time interval between samples of the time multiplexed signal, n takes all integer values representing discrete time instants and $h(nT)$ is the impulse response of a complex filter with a passband starting from zero frequency and equal to the band assigned to each input signal in the frequency multiplexed signal;
   a modulator for modulating said filtered signal with a complex periodic carrier having time samples given by $W_{2N}^{n^2}$, to provide a modulated signal having real and imaginary components, said real component being the desired frequency multiplexed signal.

2. A system for providing a time division multiplexed signal from a frequency division multiplexed single sideband signal, said system comprising:
   a modulator for modulating said frequency division multiplexed signal with a complex periodic carrier having time samples given by $W_{2N}^{-n2}$ to provide a modulated signal;

a complex time invariant filter for filtering the modulated signal to provide a filtered signal, said filter having an impulse response given by $h(nT)=h(nT)W_{2N}^{n2}$ wherein $W_{2N}$ is equal to $\exp(j2\pi/2N)$, j being the imaginary unit, N an even integer equal to the number of signals to be frequency multiplexed, T the time interval between samples of the time multiplexed signal, n takes all integer values representing discrete time instants and h(nT) is the impulse response of a complex filter with a passband starting from zero frequency and equal to the band assigned to each input signal in the frequency multiplexed signal, and wherein said filtered signal includes real and imaginary components, and wherein said real component constitutes a time division multiplexed form of N base band signals, N being an even number.

3. A system for single side band frequency multiplexing and demultiplexing, through digital processing, N signals in a base band, N being an even integer number, said signals being provided in the form of a time multiplexed signal, said system comprising:

a multiplexing path including:
(a) a complex time invariant filter having only one input and one output, said input being connected to receive the time multiplex signal, said filter having an impulse response given by $h(nT)=h(nT)W_{2N}^{-n2}$ wherein $W_{2N}$ is equal to $\exp(j2\pi/2N)$, j being the imaginary unit, N an even integer equal to the number of signals to be frequency multiplexed, T the time interval between samples of the time multiplexed signal, n takes all integer values representing discrete time instants and h(nT) is the impulse resonse of a complex filter with a passband starting from zero frequency and equal to the band assigned to each input signal in the frequency multiplexed signal;
(b) a modulator connected to the output of said filter and modulating the signal at the output of said filter through a complex periodic carrier having time samples given by $W_{2N}^{n2}$, the real component of the signal as the output of said modulator being the frequency multiplexed form of the N baseband input signals;

a demultiplexing path including:
(c) a modulator for modulating the frequency division multiplex signal with a complex periodic carrier having time samples given by $W_{2N}^{-n2}$;
(d) a further complex time invariant filter having a single input and a single output, the input of which is connected to receive the signal samples at the output of said modulator in said demultiplexing path and the output of which provides a complex signal, the real component of which is the time multiplexing of the N baseband signals, said time invariant filter having a pulse response given by $h(nT)=h(nT)W_{2N}^{n2}$.

4. The system according to claim 3 wherein the demultiplexing path includes a modulator and a filter which are identical to the modulator and filter in the multiplexing path, the filter in the demultiplexing path being connected downstream of the modulator; and wherein the N signals to be demultiplexed are obtained at the output of the demultiplexing path in the form of a time multiplexed signal wherein the N signals are arranged in time reverse order with respect to the order of signals in the multiplexing path.

5. The system according to claim 3 wherein the number N of signals to be frequency multiplexed is equal to the square or to half of the square of an integer number M, and further characterized in that the z transform of the filter h(nT) is expressed as the product of a non-recursive part and a recursive part, the recursive part having a repetitive period equal to M times a sampling frequency of each base band signal; said product of the z transform of the filter h(nT) allowing the decomposition of the filter h(nT) in M parallel paths; an implementation form of h(nT) being converted into the further form h(nT) in the filter in the multiplexing and demultiplexing paths by the introduction of proper constant multiplying coefficient into the structure of the filter h(nT).

6. The system according to claim 3 wherein the signals in said multiplexing path are samples of the N input signals sampled at a predetermined sampling frequency, and further characterized in that the spectrum of each signal entering the multiplexing path is shifted toward decreasing frequencies by a quantity equal to one-fourth the predetermined sampling frequency, thereby obtaining, at each input path, samples which are alternatively real and imaginary with increasing time; the time multiplexed form of the N input signals being applied to the filter having said impulse response wherein h(nT) is a real filter with the passband centered around zero frequency; wherein the complex output signal from said filter is applied to a further modulator along with a discrete time carrier given by $W_{2N}^{n2}$; the complex output signal from said further modulator being applied to a subsequent modulator which shifts the spectrum of said complex signal toward positive frequencies by a quantity equal to one-fourth the sampling frequency; the real output samples from said subsequent modulator corresponding to the samples of the frequency multiplexed signal; on the demultiplexing path, the modulation and filtering steps being carried out in inverted order as compared to the multiplexing path; and the frequency shifts being carried out in an order and frequency direction opposite to that of the multiplexing path.

7. The system according to claim 6 wherein the number of signals N to be multiplexed and demultiplexed is equal to the square of an integer number M, or to the half of that square, and further characterized in that the z transform of the filter h(nT) is expressed as the product of a non-recursive part and a recursive part, the recursive part having a period equal to M times the sampling frequency of the signals in each input path; a filter form allowing the decomposition of the filter in M parallel paths; said implementation form of h(nT) being converted into the further form h(nT) in the filter in the multiplexing and demultiplexing paths by the introduction of proper constant multiplying coefficients into the structure of the filter h(nT).

8. A method for single sideband frequency multiplexing several input signals which are in the form of a single time multiplexed signal, said method comprising the steps of:

filtering said time multiplexed signal, to provide a filtered signal, in a filter having an impulse response given by $h(nT)=h(nT)W_{2N}^{-n2}$ wherein $W_{2N}$ is equal to $\exp(j2\pi/2N)$, j being the imaginary unit, N an even integer equal to the number of signals to be frequency multiplexed, T the time interval between samples of the time multiplexed signals, n takes all integer values representing discrete time instants and h(nT) is the impulse response of a complex filter with a passband starting from zero frequency and equal to the band assigned to each input signal in the frequency multiplexed signal;

modulating said filtered signal with a complex periodic carrier having time samples given by $W_{2N}^{n2}$, to provide a modulated signal having real and imaginary components, said real component being the desired frequency multiplexed signal.

9. A method for time division multiplexing a frequency division multiplexed single sideband signal, said method comprising the steps of:

modulating said frequency division multiplexed signal with a complex periodic character having time samples given by $W_{2N}^{-22}$, to provide a modulated signal; and filtering the modulated signal to provide a filtered signal with a filter having an impulse response given by $h(nT)=h(nT)W_{2N}^{-n2}$ wherein said filtered signal includes real and imaginary components, and wherein said real component constitutes the time division multiplexed form of N baseband signals, N being an even number.

* * * * *